United States Patent [19]

Cuomo et al.

[11] 4,132,614
[45] Jan. 2, 1979

[54] ETCHING BY SPUTTERING FROM AN INTERMETALLIC TARGET TO FORM NEGATIVE METALLIC IONS WHICH PRODUCE ETCHING OF A JUXTAPOSED SUBSTRATE

[75] Inventors: Jerome J. Cuomo, Lincolndale; Richard J. Gambino; James M. E. Harper, both of Yorktown Heights, all of N.Y.

[73] Assignee: International Business Machines Corporation, Armonk, N.Y.

[21] Appl. No.: 844,541

[22] Filed: Oct. 26, 1977

[51] Int. Cl.$^2$ .................................................... C23C 15/00
[52] U.S. Cl. ........................... 204/192 EC; 204/192 E; 204/298
[58] Field of Search ............ 204/192 E, 192 EC, 298; 156/643

[56] References Cited

U.S. PATENT DOCUMENTS

| | | | |
|---|---|---|---|
| 3,573,185 | 3/1971 | Jennings et al. | 204/192 |
| 3,573,454 | 4/1971 | Andersen et al. | 250/41.9 |

OTHER PUBLICATIONS

G. C. Nelson, "Search for Preferential Sputtering in Ag/An Alloys," *J. Vac. Sci. Tech.*, vol. 13, pp. 974–975 (1976).

J. J. Hanak et al., "Effect of Secondary Electrons & Negative Ions on Sputtering of Films," *J. Vac. Sci. Tech.*, vol. 13, pp. 406–409 (1976).

*Primary Examiner*—John H. Mack
*Assistant Examiner*—Aaron Weisstuch

*Attorney, Agent, or Firm*—Graham S. Jones, II

[57] ABSTRACT

Bombardment some intermetallic compounds above a sufficient target voltage $V_o$ can be used for etching substrates. Etching a substrate located in an evacuated chamber involves bombardment of an intermetallic compound or alloy comprising for example Au, Pt, etc. and a metallic element such as Eu, La, Cs, etc. with ions so that a large flux of negative Au, Pt, etc. ions is produced which etches a substrate located nearby. Such bombardment is achieved by placing an Au, Pt, etc. intermetallic composition target in a sputtering chamber using an argon sputtering gas, located opposite from a substrate. A gold alloy or compound target can be SmAu, EuAu, LaAu, CsAu, etc. The target of Au, Pt, etc. and a rare earth element, etc. is bombarded by sputtering gas atoms excited by RF or D.C. energy, creating negative metal ions by sputtering. Instead of depositing upon the substrate, the negative ions cause a cascade of energetic sputtering gas atoms and metal atoms to etch the substrate surface directly beneath the target as outlined by ground shields. Outside that region negative ion and rare earth metals deposit on the substrate. Bombardment with an ion gun, neutral atoms or energetic particle sources or an ionic molecular source may produce negative ions. A use is ion milling. A target material is useful as a negative ion source of metal B in an intermetallic compound of metals A and B if A has ionization potential $I_A$ and B has electron affinity $EA_B$ such that $I_A - EA_B >$ about 3.4 electron volts or if there is a electronegativity difference $\Delta X$ greater than about 2.55.

29 Claims, 10 Drawing Figures

FIG. 5
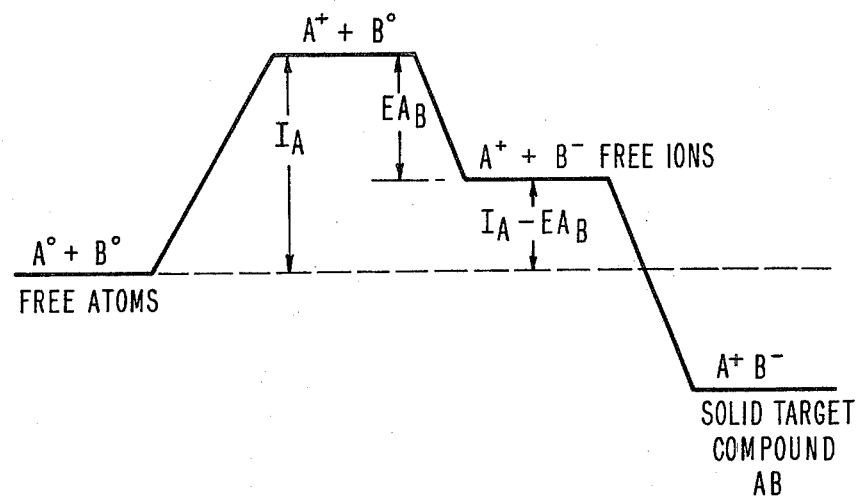
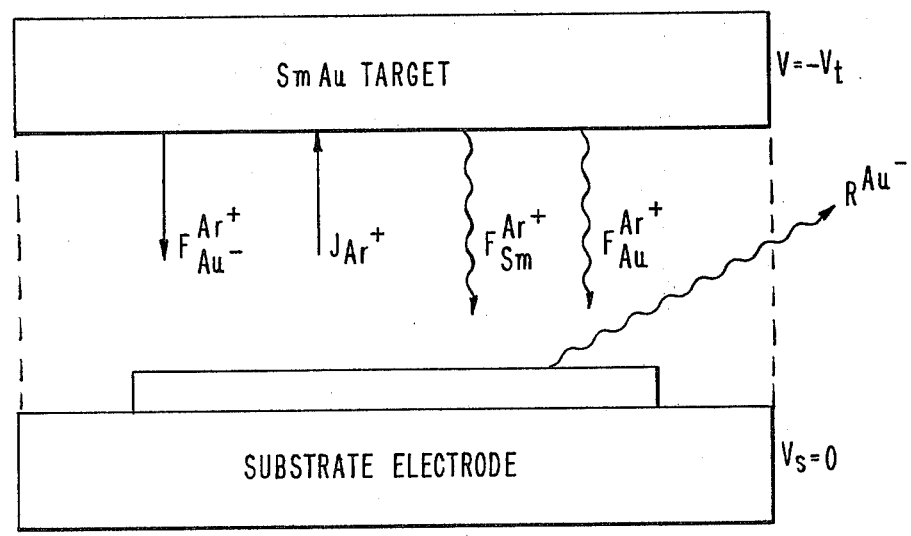
FIG. 6

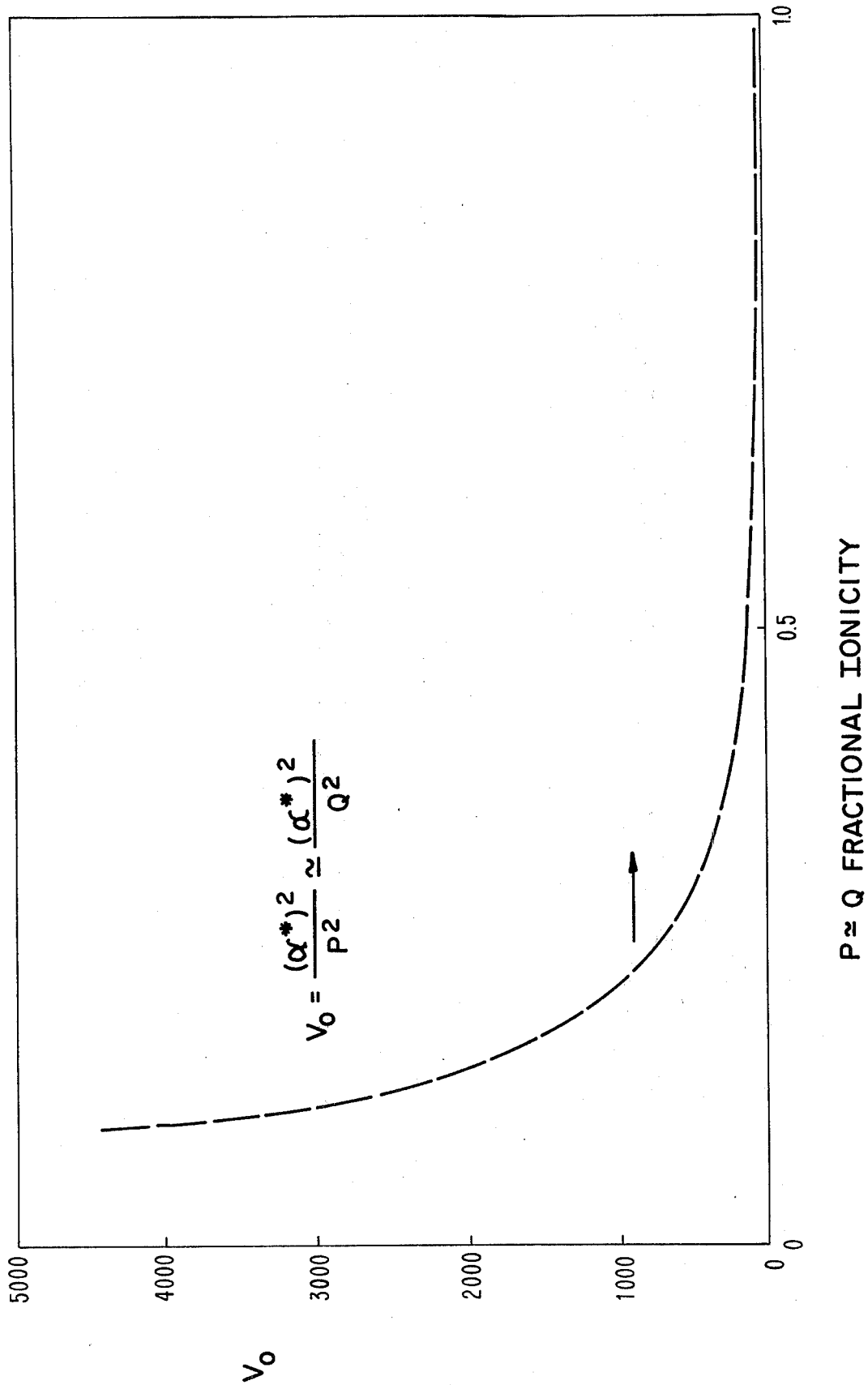

ETCHING BY SPUTTERING FROM AN INTERMETALLIC TARGET TO FORM NEGATIVE METALLIC IONS WHICH PRODUCE ETCHING OF A JUXTAPOSED SUBSTRATE

BACKGROUND OF THE INVENTION

1. Field of the Invention

This invention relates to sputtering and more particularly to etching during sputtering in the presence of negative ions.

2. Brief Description of the Prior Art

The formation of negative ions in the sputtering of highly ionic compounds such as $TbF_3$ was reported by Hanak et al "Effect of Secondary Electrons and Negative Ions on Sputtering of Films", J. Vac. Sci. Technol., Vol. 13, No. 1, Jan./Feb. 1976, pp. 406-409. It describes cosputtering from a target of $TbF_3$ and a target of ZnS, with etching of the substrate directly opposite the $TbF_3$ target. The article states "It was postulated that etching of the substrate over the $TbF_3$ was caused by the sputtering of the substrate by Fions first released by the target and then accelerated and focused onto the substrate at full target-substrate voltage..." The Article also speculates that other negative ions "such as those observed by Honig, [Refs.] 3,4 would be expected to produce a similar effect," referring to oxides, and ZnS, involving sulfide and oxide ion bombardment. Both examples selected were those of non-metals. Halide ions are also mentioned. Honig is cited by Hanak as referring to $Cl^-$, $F^-$, $Br^-$, $O^-$, $OH^-$, $O_2^-$, $S^-$, $C_1^-$ to $C_{10}^-$, $Sh^-$, $Ag_2^-$ and $Ag_2O^-$ as sources of negative ions. No mention of any intermetallic compounds or any rare earth (RE) metallic compounds is made or in any way suggested. $Ag_2^-$ was of relatively small intensity, involving few ions as compared to $Ag_1^+$, $Ag_2^+$ and $Ag_2^+$ $^{and}$ $A_{g3}^+$. Thus, little etching would be provided, if any, as our discoveries show silver to be a poor source of negative ions for etching.

Applicants present experimental data herein which shows that negative ion formation has a significant effect on the sputtering of certain intermetallic compounds and not just the highly ionic compounds previously reported by Hanak et al. In addition, applicants present a model based on electron affinity data which is useful in predicting which compounds and intermetallics will have a high negative ion Middleton et al "A Close to Universal Negative Ion Source," in *Nuclear Instruments and Methods* 118, (1974) 329-336, shows how to generate negative ion currents of metals such as Li, Ca, Ti, Cu and Ni by directing a beam of cesium positive ions from a surface ionization source to sputter a hollow target cone to generate negative ions. No suggestion is made as to an application for which such ions might be used.

U.S. Pat. No. 3,573,454 of Andersen, entitled "Method and Apparatus for Ion Bombardment Using Negative Ions" teaches using bombardment of an alumina ($AL_2O_3$) specimen with negative $O_1$ ions to produce sputtered $Al^+$ ions. Such a process can be used for ion implantation for manufacturing solid state electronic devices. a multicompanent finely divided U.S. Pat. No. 3,855,612 of Rosvold, entitled "Schottky Barrier Diode Semiconductor Structure and Method" teaches sputtering from a target formed of two materials required to form a nickel, platinum, silicon ternary compound of platinel silicide. The target is a disk of nickel with strips of platinum formed on it. The substrate is silicon. That procedure simply used a multicompnent target without suggesting that a target should include an alloy or compound of the two metals or at the very least extremely finely divied particles. For the purpose to be achieved in this invention, our experiments havve shown tht placing a strip of sumarium upon a gold target will not yield any measurable etching by negative ions of gold.

The importance of negative ion formation in sputtering came to our attention while studying the deposition of rare earth - gold alloys. We observed that under conditions that produced a good accumulation rate of GdAu we obtained zero accumulation for a SmAu target. Closer examination of the substrates used in the SmAu deposition experiments revealed that we were getting, in fact, a negative accumulation rate, i.e., etching of the substrates. The etching occurred in a sharply defined region which closely matched the size and shape of the ground shield opening of the target. Furthermore, the etching phenomona did not appear to be chemical in nature because different substrates, e.g. $Al_2O_3$, and Mo, all etched and at comparable rates.

We hypothesized from these observations that: 1) the etching was caused by sputtering; 2the ions causing the sputter etching were being accelerated away from the cathode and therefore must be negative; and 3) the ions probably had a high mass. After a series of sputter etching and Secondary Ian Mass Spectrometry (SIMS) experiments we have concluded that certain target materials have a surprisingly large yield of negative ions which can significantly effect the accumulation rate, composition and properties of sputtered films. SIMS is a process in which a beam of positive argon ions is directed upon a sample and ejected ions are analyzed by a mass spectrometer. While this phonomenon has been reported for highly ionic target materials such as $TbF_3$ by Hanak et al, it appears to be much more generic in scope than previously speculated and several additional species of compounds including intermetallic compounds not suggested by the prior art have been found to yield even stronger etching than $TbF_3$. Nothing in the prior are suggested that significant quantities of negative metallic ions of high energy could be generated in a sputtering chamber.

In accordance with this invention, a negative-ion-source-material comprises a source of negative ions of a metal B included in an intermetallic composition including a metal A and a metal B. Metal B is a metal which when combined with metal A is adapted to be ionized to a substantial degree to form highly energetic negative ions of metal B upon bombardment by energetic particles of atomic dimensions.

Preferably, the metal A has an electronegativity and metal B has an electronegativity $X_B$ such that $X_B - X_A$ is greater than about 2.55 electron Volts. Where metal B is gold, the metal A has an electronegativity less than about 3.22 electron Volts.

In any event, it is preferred that the negative ions produced should have sufficient energy to produce significant etching.

Further, in accordance with this invention, at target voltages below 3,000 Volts, at appropriate electronegativity differences greater than about 2.55 electron Volts, the target is composed of a composition selected from groups in which the B metal is Au, and the A metal is selected from the group including: Li, Na, K, Rb, Si, In, Cs, Ba, La, Ce, Pr, Nd, Pn, Sn, Eu, Tb, and Dy; in which the B metal is Pt and the A metal is selected from the group including: Li, Na, K, Rb, Cs, Ba, La, Ce, Pr, and Nd; in which the B metal is selected from the group including Ir, Hg, Po, and Os and the A metal is selected from the group including: K, Rb, Cs, and Ba; in which the B metal is Os and the A metal is selected from the group including Rb and Cs, and in which the A metal is Cs and the B metal is selected from the group including Sb and Zn.

It is to be understood that the compositions can include alloys, and other mixtures such as compressed well mixed powders, insofar as the elements are extremely finely mixed with homogeneity. Other elements can of course be present as will be obvious to those skilled in the art to the extent that they do not tend to inhibit the formation of negative ions.

In a preferred embodiment the source material is selected from a group of gold intermetallic compositions with an element selected from the group consisting of Ba, Ce, Pm, Sm, La, Eu, Pr, Nd, La, and Cs.

BRIEF DESCRIPTION OF THE DRAWINGS

FIG. 5 shows energy levels involved in electron transfer from element A to element B in the formation of the target compound AB. $I_A$ = ionization potential of element A. $EA_B$ = electron affinity of element B.

FIG. 6 shows a schematic diagram of the sputtering processes. The target voltage was $V_t$. Substrate voltage $V_s$ was O. Particle fluxes are defined below.

FIG. 9 is a plot of the dependence of Etching Threshold Voltage (Vo) upon Fractional Ionicity (Q).

DETAILED DESCRIPTION OF THE PREFERRED EMBODIMENT

We have found that negative ion formation has profound effects on the sputtering of certain compounds. In the normal use of sputtering for thin film deposition, bombardment of the target by energetic ions results in the ejection of mainly neutral species, which are collected on substrates in thin film form. With the compounds discussed here, if the however, a large flux of negative ions is ejected simultaneously with the neutral species, which can drastically affect the properties of the growing film, to the extent of completely suppressing effective film deposition and actually etching the substrates. This finding also has important implications for analysis of these materials by SIMS, in which quantitative analysis will be in error if they yield of negative ions is not taken into account.

Figure 1A:
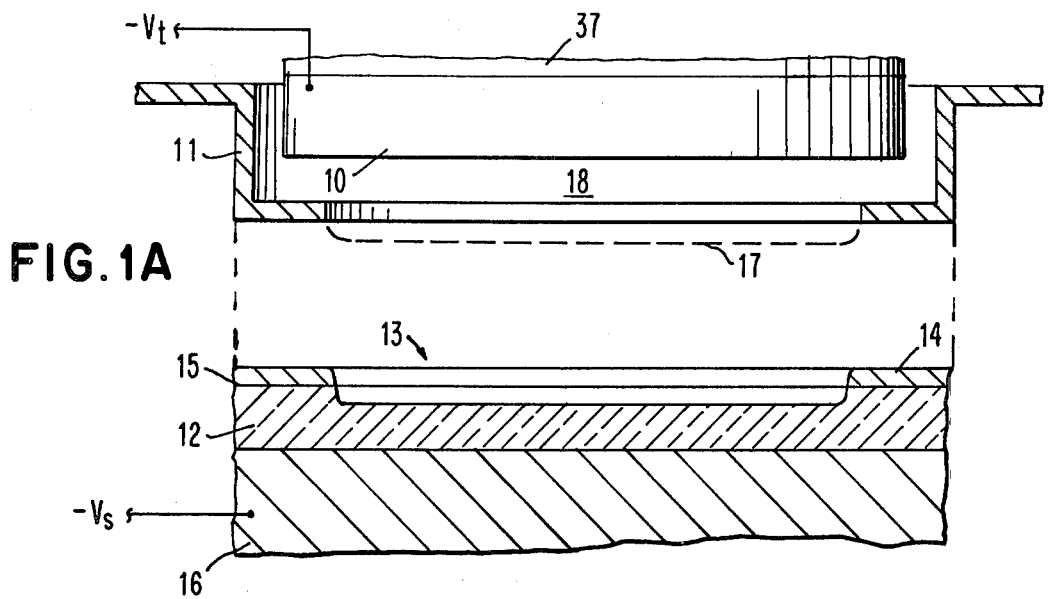
FIG. 1A shows a sketch of an RF or DC sputtering configuration including a target showing a region of etching of a substrate located opposite the position of the target. The etched region is surrounded by a region of thin film deposition.

The influence of negative ions on the sputtering process came to our attention during the sputter deposition of a series of rare earth - gold alloys. For most compounds of the series, normal film deposition occurs. For SmAu, however, the area directly under the sputtering cathode target 10 shown in FIG. 1A has no film accumulation and the substrate 12 placed on the anode substrate holder 16 is actually etched (eroded) below the original substrate surface line 15 in area 13. Outside of area 13, film deposition occurs at upper layer 14 above substrate surface line 15. The etched area closely matches the shape of the grounded, cathode shield 11 surrounding the sputtering target 10, and the etching occurs for several types of substrates (Si, glass, $Al_2O_3$, Mo), showing no evidence of being a chemical etching phenomenon. This etching is not to be confused with normal sputter-etching in which the substrates are placed on the surface of a target such as target 10 which is held at a high negative voltage to cause bombardment by positive ions of the sputtering gas. In our experiments each substrate 12 is located on the anode 16 which is held at a low negative bias voltage $V_s$ with respect to the chamber wall 36 (ground) shown in FIG. 1B, about $-50V$, such that positive ion bombardment of the substrates is insignificant. The target voltage $V_t$ is measured with respect to the walls 36 of the sputtering chamber (ground).

These observations led us to suspect that the sputtering of the substrates is due to the formation of negative gold ions at the target surface. These ions are accelerated away from the target 10 by the electric field across the dark space 18 inside dotted line 17 with enough energy to sputter the substrates and to prevent film accumulation. Further sputtering experiments and SIMS analysis have confirmed that certain materials have a suprisingly large yield of negative ions under argon ion and other ion bombardment. This negative ion flux may affect the accumulation rate, composition and other properties of the growing film on a substrate 12. While this phenomenon has been reported for highly ionic target materials such as $TbF_3$ (by Hanak), it appears that negative ion formation may be more common than previously thought. Below, we present a model based on the electron affinity data of H. Hotop and W. C. Lineberger, *J. Phys. Chem. Ref. Data*, 4, 539 (1975) which is useful in predicting which compositions including intermetallic alloys, compounds and compositions, etc. will have a high negative ion yield.

EXPERIMENTAL TECHNIQUE

The sputtering experiments were carried out in an R. F. diode system shown in FIG. 1B which has been described in J. J. Cuomo and R. J. Gambino, *J. Vac. Sci. Tech.*, 12, 79 (1975).

Figure 1B:
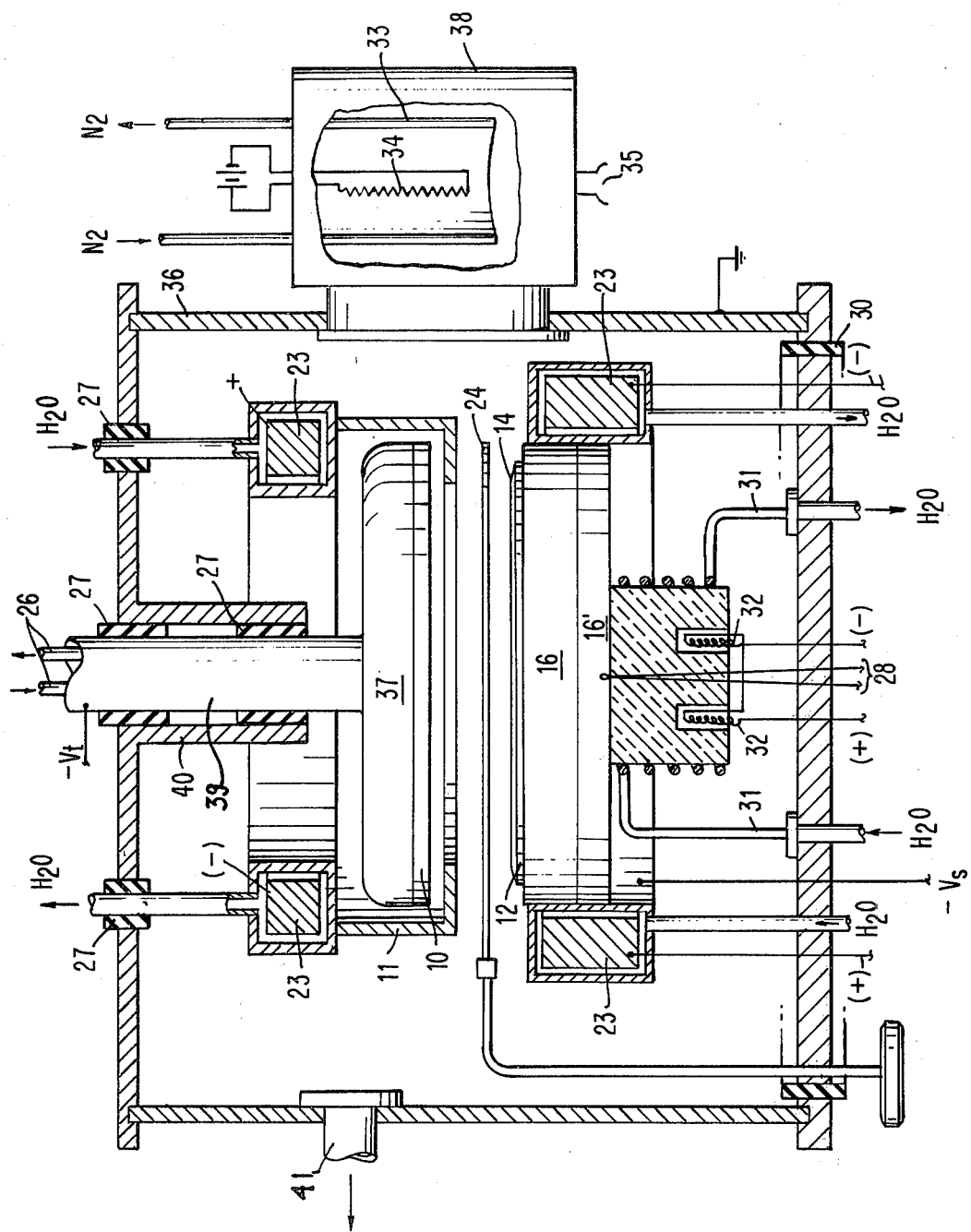
FIG. 1B shows a conventional RF or DC sputtering system employed for the purpose of etching as shown in FIG. 1A.

The sputtering system in FIG. 1B has a diode geometry and it is adapted for R.F. or D.C. sputtering. It includes a water cooled cathode target 10 with water cooling tubes 26 connected to the cathode 37 for that purpose. A cathode ground shield 11 is provided which defines the pattern of deposition and etching provided with this invention. A shutter 24 between the target 10 and the anode 16 and substrate 12 allows presputtering of the target 10 prior to deposition and sputter-cleaning of the substrate 12. Water cooled electromagnets 23 are built into the system, although they are not essential to this invention. The target 10 and anode 16 are built into a stainless steel chamber 36 which is pumped by a Freon fluorinated hydrocarbon coolant baffled six in. diffusion pump (not shown). A titanium sublimation pump 34 with a liquid nitrogen cooled stainless steel shroud 33 is attached, in area 38 through a portal, to the system, where the sputter gas is admitted through port 35. Another pump 34 (not shown) is attached to the sputtering chamber 36. The chamber is typically prepumped to $5 \times 10^{-8}$ Torr using the two sublimation pumps 34 in combination with the six in. diffusion pump which is connected to portal 41. The chamber 36 is partially isolated from the diffusion pump by a non sealing valve (not shown) between portal 41 and the six in. pump producing a pressure differential when 99.995 argon is introduced into the system. The sputter gas is introduced through the chamber Ti/Cryo pump area 38 providing further purification. The argon pressure is controlled using capacitance manometer sensing and controlling an automatic valve. With the shutter 24 covering a substrate 12, the target 10 is presputtered for about one half to one hour to clean the target surface and help getter the system of background impurities. The substrates are exposed to the atom flux from the target after the predetermined conditions for the substrates are set for the run. Generally, the substrates are water cooled and gallium backed and depositions from 0.5 to 2 hrs. produced thickness of about 0.5 to 2.0 μm, respectively.

Cathode isolation insulators 27 are provided between the cathode shaft 39 and housing 40 which supports it by attachment to chamber 36. A substrate thermocouple 28 is located below in the anode substrate holder support 16' to measure the approximate substrate temperature. An annular anode isolation insulator 30 is provided to insulate the substrate 12, anode 16, etc. from the walls of chamber 36. Substrate cooling coils 31 are wrapped about the base of support 16', which houses D.C. heating elements 32. A source of R.F. or D.C. power (not shown) is provided as well known by those skilled in the art.

Targets were prepared by arc melting followed by melting into a shallow Mo dish serving as a backing plate also. Most of the other targets were prepared by the same method including Rare Earth (RE) materials in combinations RE-Ag, and RE-Cu and also $Al_2Au$. A cesiumgold target was among them. Sintered targets of $LaF_3$ and $CeF_3$ were also used. A CsAu target was prepared by heating Au foil in Cs vapor in a sealed quartz ampoule for six hours at 450° C. A sintered target of $LaF_3$ was also used. Substrates were held on a water cooled anode with thermally conducting compound. Target voltages of $-500V$ to $-2500V$ were used with an anode voltage (substrate bias) of $-50V$. Substrates of Si, $Al_2O_3$ and glass were used. The etch step was measured on a Taylor-Hobson Talysurf surface profile measuring instrument at a step created by a small masking chip of $Al_2O_3$. In some cases the step at the boundary of the etched region which is defined by the grounded target shield 11 was also sharp enough to be measured on the same instrument. The composition of the material deposited outside the etched region was determined by electron microprobe analysis. Most of the experiments were carried out using a fixed target voltage ($V_t = -1000$ Volts), bias voltage ($V_b = -50$ Volts), working gas composition (argon) and pressure (P=30 mTorr) in order to study the accumulation rate from various target compositions. In most cases the targets were 1:1 rare earth - X intermetallic compounds, where X represents Cu, Ag, Au, Pt or Pd. The Sm-Au system was studied over a range of compositions.

Measurements of substrate etch rates using the SmAu target were made as a function of substrate material, target voltage $V_t$, substrate bias voltage $V_s$, sputtering gas composition (Ar,Kr,Ne,Xe and He), and pressure. Further studies were made with other compositions of the Sm-Au binary system, as well as with LaAu, NdAu, EuAu, GdAu, TbAu, DyAu, YbAu, YAu, SmCu, SmAg, SmPt, CsAu, $Al_2Au$ and $LaF_3$.

To correlate negative ion formation with the etching phenomenon, SIMS measurements were carried out on several of the above compounds, using a Cameca ion microscope with a $10KeV(Ar^+)$ argon ion beam. To facilitate secondary ion extraction, the target is biased to $-4.5$ kV for ion collection, thus for negative ion detection the effective accelerating voltage is 14.5kV and for positive ion detection is 5.5kV. These accelerating energies are higher than the 500V to 2500V energies used in the sputtering experiments. We believe that a valid comparision of the negative ion yield of different materials may be made even through the absolute magnitude of negative ion yield is expected to depend on the positive ion accelerating energy.

In the SmAu and EuAu systems the dependence of etch rate on target voltage was determined. Also, other inert gases besides argon were used as well as a range of gas pressures.

Measurements were made only after ion bombardment of sufficient length to "clean" the surface. Primary beam currents were in the $10^{-6}$ Amp. range and the beam hit the sample at approximately a 45° angle. The beam size was on the order of 100 micrometers in width.

The target ingots 10 were prepared by arc melting the constituents in a water cooled copper hearth and in designated cases checked for composition and homogeneity with an ARL-SEMQ Electron Microprobe.

EXPERIMENTAL RESULTS

In this section a summary of experimental results will be presented which illustrates the negative ion behavior.

A. Sputtering

1. SmAu binary system

The highest substrate etch rates were measured using a SmAu 1:1 composition target. Up to 3 microns of Si was etched in one hour under condition which would normally deposit 2 to 3 microns of film on the Si substrate. Lower etch rates were found with a target having a composition of $Sm_{.75}Au_{.25}$, and no substrate etching occurred with a $Sm_{.25}Auhd.75$ target.

Figure 2:
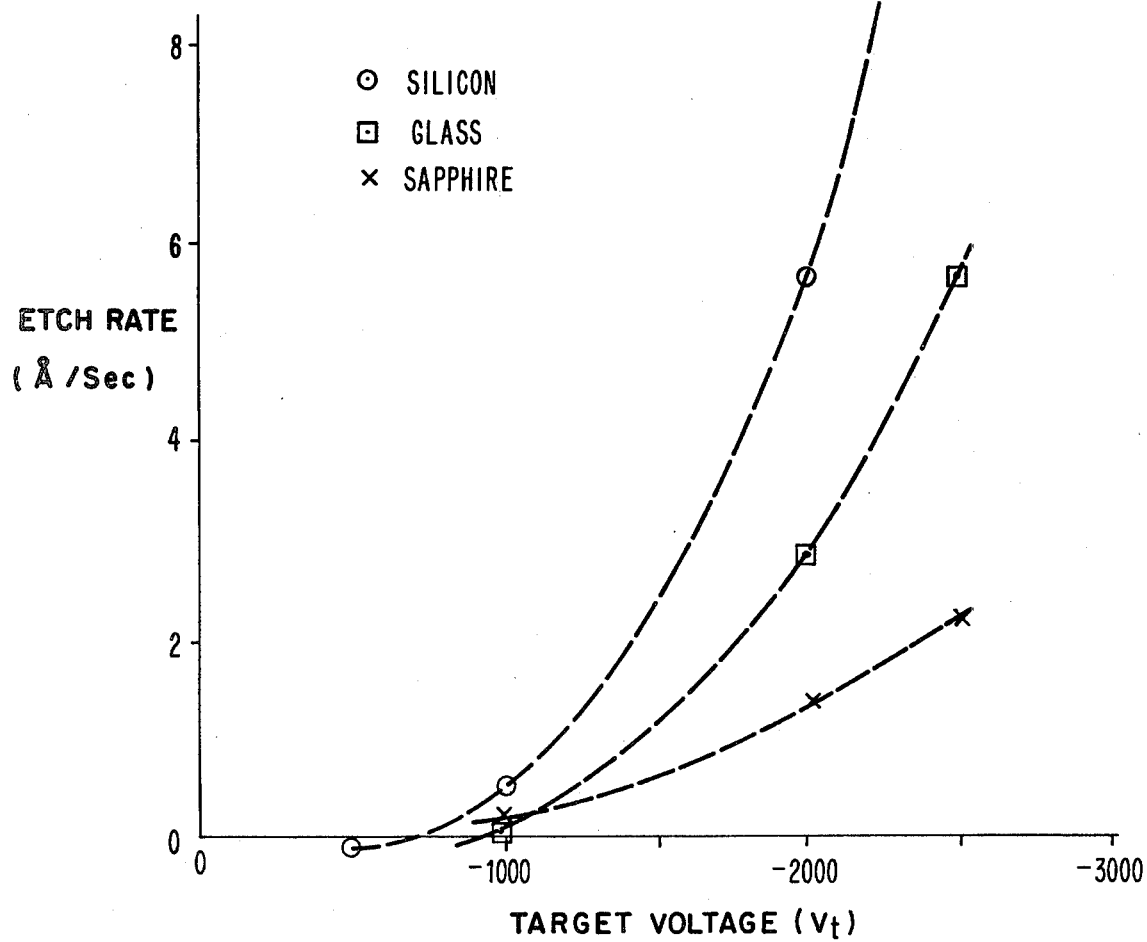
FIg. 2 shows the rate of substrate etching versus target voltage for a SmAu target with silicon, glass, and sapphire substrates. The argon pressure was 30 mTorr (4Pa), V bias was 50 Volts, and target-to-substrate distance was 5 cm.

The most pronounced dependence of substrate etch rate on sputtering parameters is on the target voltage $V_t$. FIG. 2 shows the etch rate of Si, glass and sapphire substrates for target voltages from $-500V$ to $-300V$. (SmAu target, Ar pressure = 4 Pa, $V_s = -50V$, target to substrate distance = 5 cm). The dependence of the etch rate on the substrate material is consistent with the sputter yields of the substrates. The strong dependence on $V_t$ is faster than linear and suggests that the etch rate depends on both the energy and the flux of negative ions from the target. Also, since gold is about five times as heavy as argon, it tends to have a higher sputtering yield (number of atoms dislodged per incident atom), than argon. At low target voltage (below about −750V for the conditions given above) the substrates are no longer etched, and film deposition occurs (shown in FIG. 4 by a negative etch rate).

Figure 3:
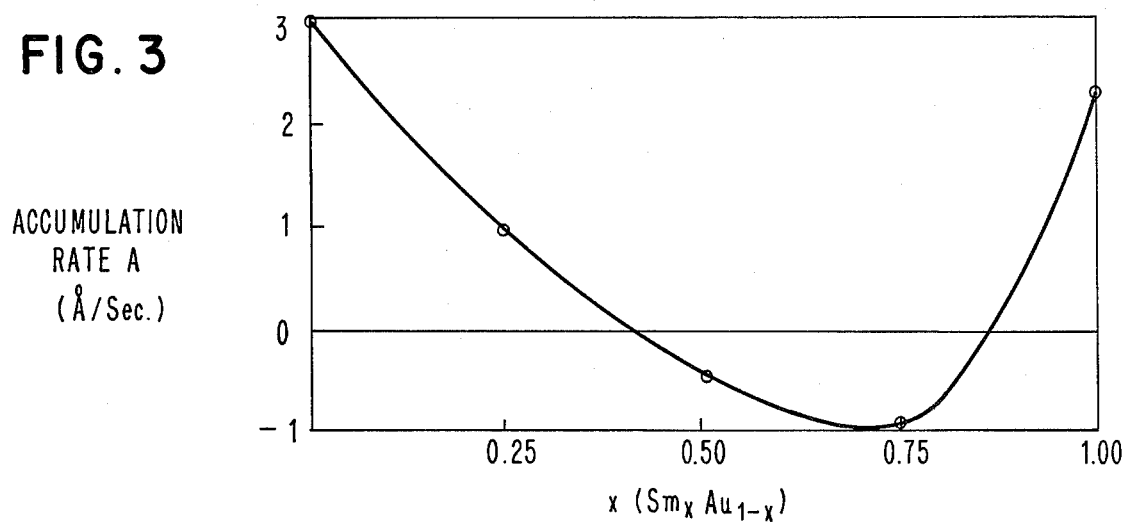
FIG. 3 shows the accumulation rate A measured for target compositions in the $Sm_xAu_{1-x}$ series. Sputtering parameters were: $V_{target}(V_t) = -1000V$, $V_{substrate}(V_s) = -50V$, gas pressure = 30 mTorr Ar, target-to-substrate distance = 5 cm.

The accumulation rates from targets of various compositions in the $Sm_xAu_{1-x}$ binary system are shown in FIG. 3. The accumulation rate is negative (etching) for two compositions SmAu and $Sm_3Au$. SIMS ion yields for the same series are listed in Table I in two ways: first, the actual counts observed and secondly, corrected for concentration to pure element counts. This is meant to give a feeling for the enhancement or depression of the secondary ions.

Table I

| Composition | | $Sm_{152}{}^+$ | SIMS ion yields[a] in $Sm_xAu_{1-x}$ series $Sm_{152}{}^-$ | $Au_{197}{}^+$ | $Au_{197}{}^-$ | $O_{16}{}^-$ |
|---|---|---|---|---|---|---|
| Sm | | $1.74 \times 10^5$ | $8.4 \times 10^1$ | — | — | — |
| $Sm_3Au$ | | $2.4 \times 10^5$ | $1.1 \times 10^2$ | $2.3 \times 10^2$ | $.26 \times 10^6$ | $4.3 \times 10^5$ |
| | (b) | $3.19 \times 10^5$ | $1.4 \times 10^2$ | $9 \times 10^2$ | $1.04 \times 10^6$ | — |
| SmAu | | $6.7 \times 10^5$ | Bkg.[c] | Bkg. | $1.52 \times 10^6$ | $2.5 \times 10^5$ |
| | (b) | $1.33 \times 10^6$ | Bkg. | Bkg. | $3.03 \times 10^6$ | — |
| $SmAu_3$ | | $1.09 \times 10^6$ | Bkg. | $9.5 \times 10^2$ | $1.02 \times 10^6$ | $1.78 \times 10^4$ |
| | (b) | $4.36 \times 10^6$ | Bkg. | $1.3 \times 10^3$ | $1.36 \times 10^6$ | — |
| Au | | — | — | $3.3 \times 10^3$ | $2 \times 10^2$ | — |

Footnotes:
[a] Yields are given as counts/sec. averaged over 200 sec.
[b] Yields corrected for concentration to "pure" element counts.
[c] Bkg. - Background Table II shows the alloy compositions as determined by electron microprobe. The yields are relative to each other within each mode of detection, positive ions or negative ions. Counts were corrected when necessary for detector response at the higher counting rates. Also, $O_{16}{}^-$ counts are listed and follow the Sm concentration. This indicates that oxygen is probably a contaminant of the Sm. Some surface reoxidation may also occur during the SIMS measurement, in the relatively poor vacuum ($10^{-7}$ Torr) before the SIMS ion beams was turned on. Note in Table I that the $Au^-$ yields of the $Sm_xAu_{1-x}$ compositions are about four orders of magnitude higher than that of pure gold. The compositions with a high $Au^-$ yield have a low accumulation rate ($SmAu_3$) or etch (SmAu and $Sm_3Au$). In addition, we note that the $Sm^+$ yield is significantly higher in the Sm-Au mixtures than in pure Sm metal.

Table II

| Composition[a] of $Sm_xAu_{1-x}$ series | | |
|---|---|---|
| | Mole Fractions | |
| | Sm | Au |
| $Sm_3Au$ | .75 | .252 |
| SmAu | .48 | .52 |
| $SmAu_3$ | .256 | .74 |

[a] Compositions measured by electron microprobe with relative accuracy ± 3% and relative precision ± 2% (95% confidence level).

The dependence of etch rate on other sputtering parameters is less pronounced. Etch rate increases with bias voltage and pressure, and preliminary experiments show a different etch rate when a sputtering gas other than argon is used.

2. Other Au compounds

To study the range of occurrence of the etching phenomenon, other gold alloys of 1:1 composition were investigated. Compounds which show the etching phenomenon include NdAu, PrAu, SmAu, EuAu, LaAu, CsAu. Those which deposit films normally include GdAu, TbAu, DyAu, YbAu, YAu. Others which deposit at low target voltages are PrAu and NdAu (see Table III footnotes c and g). The pattern of occurrence of the etching phenomenon suggested a dependence upon electronegativity differences, which led to the model discussed below.

In the case of CsAu, the glow discharge showed clear evidence of a collimated area between the target and the substrate, contrasted with the more diffuse appearance of the DyAu discharge from which normal films deposit. Other compounds, however, did not show this distinct effect an the glow. This observation suggests that a more quantitative measurement of the optical spectrum of the plasma may show distinctive features associated with negative ion formation.

Figure 4:
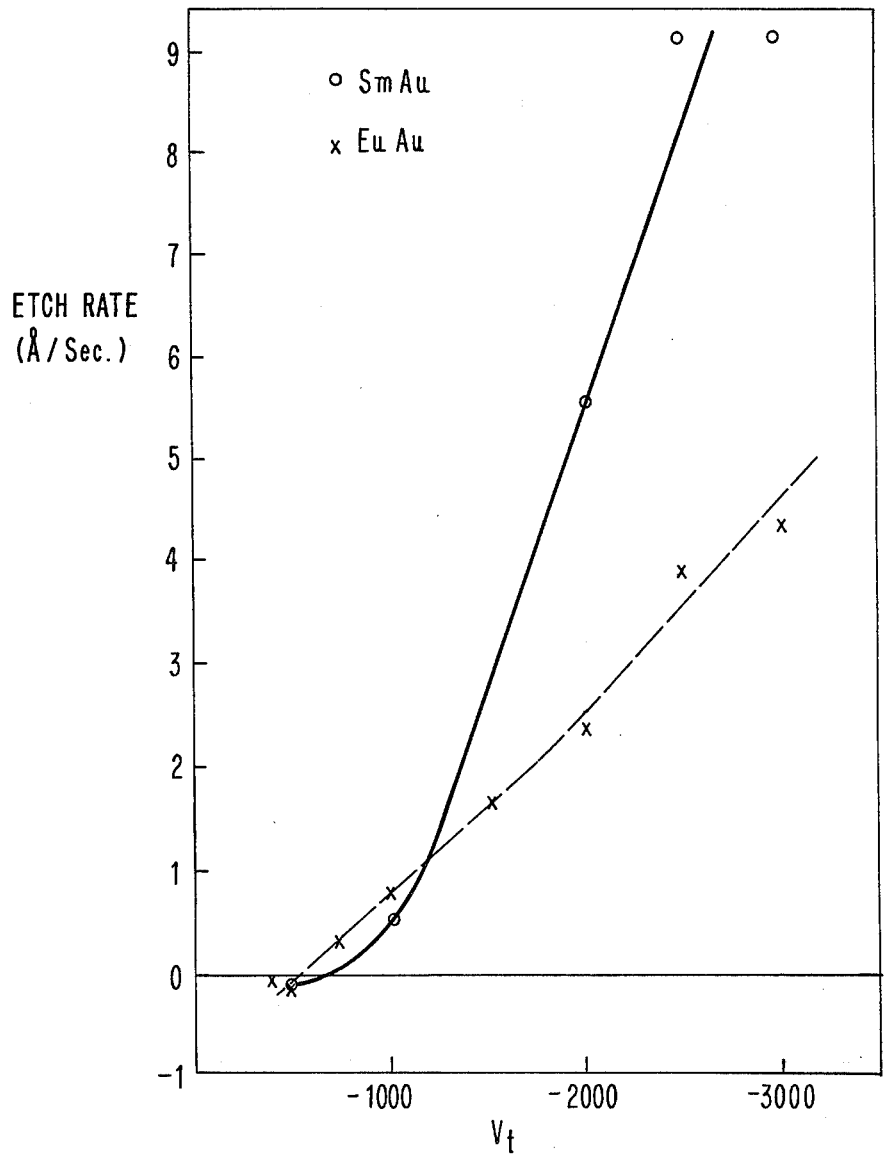
FIG. 4 shows curves of silicon substrate etch rates vs. target voltages of SmAu and EuAu target. Sputtering parameters were the same as those in FIG. 3.

The etch rate of Si wafers as a function of target voltage is shown in FIG. 4 for SmAu and EuAu. Etch rates up to 9 Å/sec were found using SmAu with a target voltage of −3000V. Higher values can be measured due to trenching next to the masking wafer. The values shown in FIG. 4 are more typical. The etch rate is clearly a strong function of target voltage. A threshold target voltage of −500V to −750V must be exceeded before etching occurs in both EuAu and SmAu. Below this absolute value of $V_t$, deposition occurs.

Etching has also been observed with the SmAu target in krypton and neon as well as argon. The etch rate appears to be weakly dependent on working gas pressure in all cases. The rate increases with increasing pressure from 10 mTorr to 60 mTorr probably because of the increase in positive ion current with pressure. A slight increase in etch rate is also found for increased substrate bias voltage from −50V to −200V.

Most of the 1:1 rare earth-gold compositions have been studied; the accumulation (or etch) rates are listed in Table III. Of the REAu (Rare Earth, Gold) compounds studies only LaAu, SmAu, PrAu, NdAu, and EuAu show the etching phenomenon. The deposition rates of some of the other compounds are relatively low, however, indicating that some negative ions provide etching during deposition, but not enough to prevent accumulation of a film at the negative value of target voltage $V_t$ used which is below the negative value of $V_o$ as defined below.

Table III

| Accumulation rate data of rare earth - gold targets | | | | |
|---|---|---|---|---|
| Compound | Result | Rate[a] A/sec | RE[e] I eV | Au[f] EA eV | I-EA eV |
| LaAu | Etch | −0.28 | 5.58 | 2.31 | 3.27 |
| CeAu | (h) | | 5.47 | 2.31 | 3.16 |
| PrAu | Deposit | +0.40[c] | 5.42 | 2.31 | 3.11 |
| NdAu | Deposit | +0.78[g] | 5.49 | 2.31 | 3.18 |
| PmAu | | | 5.55 | 2.31 | 3.24 |
| SmAu | Etch | −0.50 | 5.63 | 2.31 | 3.32 |
| EuAu | Etch | −0.81 | 5.67 | 2.31 | 3.36 |

Table III-continued

Accumulation rate data of rare earth - gold targets

| Compound | Result | Rate[a] A/sec | RE[e] I eV | Au[f] EA eV | I-EA eV |
|---|---|---|---|---|---|
| GdAu | Deposit | +4.82[b] | 6.14 | 2.31 | 3.83 |
| TbAu | Deposit | +7.39[b] | 5.85 | 2.31 | 3.54 |
| DyAu | Deposit | +3.39[b], [d] | 5.93 | 2.31 | 3.62 |
| HoAu | Deposit | +1.26 | 6.02 | 2.31 | 3.71 |
| ErAu | | | 6.10 | 2.31 | 3.79 |
| TmAu | | | 6.18 | 2.31 | 3.87 |
| YbAu | Deposit | +0.8 | 6.25 | 2.31 | 3.94 |
| LuAu | Deposit | +1.3 | 5.43 | 2.31 | 3.12 |
| YAu | Deposit | +1.91[b] | 6.38 | 2.31 | 4.07 |

Footnotes:
[a]Sputtering parameters (except where noted) are $V_{target} = -1000V$, $V_{substrate} = -50V$, pressure = 30 mTorr Ar, target-to-substrate distance = 5 cm. Etch rates are for Si substrates. Target diameter was about 6.35 cm.
[b]These data are converted from runs at higher target voltages assuming accumulation rate proportional to $|V_t|^{3/2}$.
[c]At $V_t = -1000V$, PrAu deposits a film with a well defined ring and at $V_t = -2000V$, etches Si at 1.0 A/sec.
[d]At $V_t = -1100V$, DyAu deposit a film with a well defined ring.
[e]RE-rare earth, see Moore, below.
[f]See Hotop et al, above
[g]At $V_t = -2500$ Volts, NdAu shows a small etched region on the substrate.
[h]A CeAu target produced no results because of oxidation of the target.

3. Other Sm compounds

Variations of the second constituent were also made. SmAg, SmCu, SmPd and SmPt were found to deposit normal films.

4. Other compounds

LaF$_3$ shows substrate etching although it is not an intermetallic compound. The accumulation rates for these materials are given in Table IV. No etch rate data was obtained for CsAu due to the short life of the target. SIMS results for several of these compounds are given in Table V. There is a clear difference in the yield of Au$^-$ ions between the compounds which etch (SmAu, CsAu) and the compounds which deposit normal films (YbAu, GdAu, YAu, Al$_2$Au). The difference is an order of magnitude or more. The results from Table III cannot be directly compared to the values in Table I since they were done on different days and alignment varies. However, within each Table comparisons can be made. High O$^-$ yields are again associated with these reactive materials. CsAu in particular had a contaminated surface. However, the differences in Au$^-$ yield correlate well with the negative ion etching behavior observed in sputtering.

Table IV

Accumulation rate data of various target compositions

| Composition | Result | Rate[a] A/Sec | $I_A$ (eV) | $EA_B$ (eV) | ($I_A - EA_B$) (eV) |
|---|---|---|---|---|---|
| CsAU | Etch | — | 3.89 | 2.31 | 1.58 |
| LaF$_3$ | Etch | −0.55 | 5.61 | 3.40 | 2.21 |
| SmPt | Deposit | +1.09[b] | 5.63 | 2.13 | 3.47 |
| Al$_2$Au | Deposit | +1.69[b] | 5.98 | 2.31 | 4.07 |
| SmAg | Deposit | +2.53 | 5.63 | 1.30 | 4.33 |
| SmCu | Deposit | +0.83 | 5.63 | 1.23 | 4.40 |
| SmPd | Deposit | +2.05[b] | 5.63 | 0.60 | 5.03 |

Footnotes:
[a]Sputtering parameters (except where noted) are $V_t = -1000V$, $V_s = -50V$, pressure = 30 mTorr Ar, target-to-substrate distance = 5 cm. Etch rates are for Si substrates, target diameter was about 6.35 cm.
[b]These data are converted from runs at higher target voltages assuming accumulation rate proportional to $V_t^{3/2}$.

Table V

SIMS ion yields[a] for various gold target compounds.

| | Au$_{197}^-$ | O$_{16}^-$ |
|---|---|---|
| SmAu | 3.3 × 10$^5$ | 7.1 × 10$^4$ |
| CsAu | 2.60 × 10$^5$ | 1.5 × 10$^4$ |
| YbAu | 3.42 × 10$^4$ | 5.4 × 10$^4$ |
| GdAu | 2.0 × 10$^4$ | 3.0 × 10$^4$ |
| YAu | 7.0 × 10$^4$ | 4 × 10$^4$ |
| Al$_2$Au | 2.2 × 10$^3$ | — |

Footnote:
[a]Yields are given as counts/sec averaged over 200 sec.

B. Secondary Ion Mass Spectrometry (SIMS)

The above results also emphasize the necessity of taking into account negative ion yield as well as positive ion yield in attempting quantitative SIMS measurements with these materials. This is in addition to the normal problems in quantitative SIMS, described in NBS Special Pub. 427, *Secondary Ion Mass Spectrometry*.

Examination of several target compounds by SIMS confirmed the generation of large amounts of negative gold ions from the target materials which show the etching phenomenon, and small amounts from these materials which deposited normal films. The flux of negative gold ions from SmAu is more than an order of magnitude higher than from GdAu, which does not show the etching behavior, and several orders of magnitude higher than from pure Au. Also the flux of positive gold ions from SmAu is barely detectable, much less than from pure Au.

MODEL OF NEGATIVE ION FORMATION

The question exists as to why some targets yield a high flux of negative ions and others do not. We have developed a simple model for negative ion formation which allows us to predict which compositions will provide sufficient negative ion production to etch a substrate and which will deposit on that substrate. The starting point of our model is the sputtering of simple ionic compounds. Since Au has the highest electronegativity (X) of any metal, this was expected to be a controlling parameter. Although the detailed mechanism of how a sputtered Au atom leaves the surface with an attached electron is not yet understood, it seemed reasonable that the process would be enhanced when the Au is combined with an element of low electronegativity X, which would facilitate electron transfer from that element to the Au. Using electronegativity data recently compiled by Michaelson in H. B. Michaelson, "The Relationship Between a New Electronegativity Scale and the Work Function," I.B.M. Journal of Research and Development, pages 72–80, Vol. 22, January 1978. A tabulation was made of the electronegativity difference (ΔX) between the constituents of the targets. It was found that target compounds which show the etching phenomenon have a value of electronegativity difference ΔX higher than about 2.65 eV, while compounds which do not show etching have a lower value. Only one exception to this pattern was found, LuAu. Thus it appears that a threshold in electronegativity difference ΔX, or ionicity, is probably involved in determining the production of negative ions.

Further consideration of the process of charge transfer suggested treating the target compound more like an ionic solid, even though the ionicity of these metal compounds is not considered to be high. In this way, some measure of the energy required to transfer an electron from the first constituent element of the target compound AB to the second element may be obtained.

In the ionic compounds, negative ions are present in the solid. Under Ar+ bombardment the atoms are ejected from the solid in the ionized rather than the neutral state as in the case of covalently or metallically bonded solids. The negative ions leaving the target experience a large accelerating voltage approximately equal to the target voltage $V_t$, the potential drop across the target dark space. These negative ions can bombard the substrate and cause resputtering of the growing film.

Negative ions are able to be sputtered from an ionic compound AB because of the high electron affinity of the B atom. Our results show that Au also has a high enough electron affinity to be ejected as a negative ion from certain target compounds. The process is enhanced when the Au is combined in the target with an element of low ionization potential, which facilitates electron transfer from that element to the Au.

We may follow the process of electron transfer as outlined in FIG. 5 to obtain a measure of the energy required. To transfer an electron from the first constituent element of the target an energy equal to the ionization potential $I_A$ must be supplied to remove an electron from A, yielding A+. An energy equal to the electron affinity of element B, $EA_B$, is recovered by forming a negative ion B. Thus, the difference $(I_A - EA_B)$ is a measure of the difficulty of transferring an electron from A to B. In the solid, the energy is lower (final level in FIG. 5) due to the coulomb attraction and formation of bonds in the metal.

The final energy level is not easily calculated, but within an isostructural series of compounds it is reasonable to compare values of $(I_A - EA_B)$ to estimate the ease of charge transfer in the compound AB. We have found that this comparison correlates with the occurrence or nonoccurrence of substrate etching. The values of $I_A$ (by C. E. Moore, National Standards Reference Data Series 34, U.S. Government Printing Office, Washington, D.C. 1970), $EA_B$ (by Hotop et al above) and $(I_A - EA_B)$ are tabulated in Tables III and IV above for the compounds studied. We find that those compounds with $(I_A - EA_B)$ less than about 3.4eV exhibit etching, with the exception of LuAu. Those compounds with $(I_A - EA_B)$ greater than 3.4eV deposit normal films. Thus we have a systematic way of predicting the occurrence of negative ion etching in the sputtering of other compounds It should be noted that the electronegativity difference, $\Delta X$, is closely related to the parameter $I_A - EA_B$. The electronegativity difference for composition AB is defined as:

$$\Delta X = X_B - X_A \qquad (i)$$

The electronegativities of the elements A and B are defined according to Mulliken (below) as:

$$X_A = \frac{I_A + EA_A}{2} \qquad (ii)$$

$$X_B = \frac{I_B + EA_B}{2}$$

So that equation (i) can be written $$\Delta X = \left(\frac{I_B + EA_B}{2}\right) - \left(\frac{I_A + EA_A}{2}\right) \qquad (iii)$$

-continued
$$\Delta X = \frac{(I_B - EA_A) - (I_A - EA_B)}{2}$$

When A is a rare earth and B is Au, equation (iii) becomes $$\Delta X = \frac{(I_{Au} - EA_{RE}) - (I_{RE} - EA_{Au})}{2} \qquad (iv)$$

For the rare earth - gold series of compositions, since $I_{Au}$ is constant and $EA_{RE}$ is the same for all the rare earth elements, the quantity $(I_{Au} - EA_{RE})$ is constant. Thus, $\Delta X$ and the parameter $(I_{RE} - EA_{Au})$ are related simply by a constant.

When considering elements from various groups in the periodic table, it is better to use the electronegativity directly rather than the related parameter (I-EA).

Negative ion production may not necessarily result in substrate etching in the sputtering configuration. For example, neutral flux from the target may mask the negative ion bombardment and result in depositing a film. This appears to be the case for $Sm_{.25}Au_{.75}$ which shows a measurable quantity of negative gold ion yield in SIMS, but that ratio deposits a film. It is felt that detailed SIMS measurements will show that negative ion production is not characterized by a sharp threshold at $(I_A - EA_B) = 3.4$eV, but occurs over a wide range of target composition to varying degrees. Negative ion yield analysis by SIMS may in this way be a useful tool in studying charge transfer (degree of ionicity) in compounds.

Using the value of $(I_A - EA_B) = 3.4$eV as a dividing line, other target compounds may be identified as candidates for negative ion etching in sputtering. Since this is only a rough guide to materials likely to produce negative ions, a detailed listing of materials will not be given. However, certain classes of material are clearly good prospects for negative ion etching. These are:

Halides (F, Cl, Br, I, At) of the alkali metals, alkaline earths, all rare earth metals, several transition metals, and Al, Ga, In, Tl.

Chalcogenides (O, S, Se, Te, Po) of the alkali metals, some alkaline earths and some rare earth metals.

Pt and especially Au compounds with some of the rare earth metals.

Also, negative ions of the second (b) element are predicted for many compounds of the alkali metals, the most profuse amounts being obtained with K, Rb, Cs, which should produce negative ions of many B metals in the center of the periodic table. Lithium and sodium should produce negative ions of several B metals in the center of the periodic table.

It appears that the reason SmAu emerged as the prototype compound for this phenomenon is that Au has the highest electron affinity of any material except the halogens, and Sm is one of a group of rare earths with low ionization potential, slightly above the alkali metals. Thus the parameter $(I_A - EA_B)$ is favorable for this combination.

Several comments should be made regarding the process of ejection of negative ions by sputtering. We assume simply that negative ions are sputtered directly from the surface in a manner similar to neutrals. We have not attempted to incorporate directly the electric field dependence of negative ion yield, which one might expect in analogy to negative ion surface ionization described in N. I. Ionov, *Progress in Surface Science* 1, p. 237-354 (1972). In the latter process discussed in Ionov, the negative ion yield depends exponentially on a term involving the difference between the work function of the surface and the electron affinity of the desorbing ion. This appears analogous to the term $(I_A-EA_B)$ used here. The electric field and the temperature dependence may be overshadowed by the high rate of surface erosion by inert gas sputtering.

The values of electron affinity given in Hotop et al, above are only for negative ions stable for longer than $10^{-6}$ seconds. In this time an $Au^-$ ion crosses the dark space. Thus it is possible that short-lived negative ions also play a role in sputtering, picking up energy immediately adjacent to the target surface, and then bombarding the substrate as energetic neutrals. The mean free path of an energitic atom or ion is sufficiently longer than thermal mean free paths that the background gas may offer little resistance to the flow of ions and neutrals to the substrate.

DEPENDENCE OF ETCH RATE ON SPUTTERING PARAMETERS

The negative ion flux from the target is only one of the factors which determine if etching will occur. In order to get a first order estimate of the dependence of etch rate on sputtering parameters and target and substrate properties, we derive an expression for the accumulation rate, A (negative accumulation rates represent etch rates). This will show the pronounced dependence of etch rate on target voltage illustrated in FIG. 4.

A schematic representation of the sputtering experiment is shown in FIG. 6 for SmAu. The target is biased to a negative potential $V_t$. For simplicity we consider the case of zero effective bias $V_s$ on the substrate electrode. The notation in this figure uses a superscript to indicate the bombarding ion causing sputtering of the ion or atom indicated by a subscript. For example, $F_{Au}^{Ar+}$ represents the flux (F) of $Au^-$ ions caused by $Ar^+$ ion bombardment. Straight arrows are used to indicate species accelerated across the cathode dark space in the direction indicated, i.e., $Au^-$ or $Ar^+$. Wavy arrows indicate species which are not accelerated after leaving the surface they are sputtered from.

The starting point of our derivation is the equation (from Cuomo et al, above):

$$A = SF - R \tag{1}$$

where A is the accumulation rate, F is the flux from the target, S is a geometric factor giving the fraction of the flux which reaches the substrate, and R is the resputtered flux. In the zero effective substrate bias case, we can neglect resputtering due to $Ar^+$ bombardment and consider only the resputtering caused by $Au^-$ ($R^{Au-}$). In order to get the form of the functional dependence, we assume $S = 1$, neglect the loss of kinetic energy of gold ions due to collisions after they leave the dark space region, and treat the case of an SmAu substrate. Using these simplifying assumptions, we write: $A = A_{Sm} = A_{Au} = (F_{Sm}^{Ar+} - R_{Sm}^{Au-}) + (F_{Au}^{Ar+} + F_{Au^-}^{Ar+} - R_{Au}^{Ai-})$ (2)

The flux of Sm, both neutral and positively ionized, is expressed by:

$$F_{Sm}^{Ar+} = J_{Ar} + \epsilon_{Sm}^{Ar+} C_{Sm} \tag{3}$$

where $J_{Ar+}$ is the argon ion current density at the target, $\epsilon_{Sm}^{Ar+}$ is the Sputtering yield of Sm under argon bombardment and $C_{Sm}$ is the surface concentration of Sm at the target.

For gold we write separate expressions for the neutral and ionized species as follows:

$$F_{Au}^{Ar+} = J_{Ar+} \epsilon_{Au}^{Ar+} C_{Au}(1-P) \tag{4}$$

$$F_{Au-}^{Ar+} = J_{Ar+} \epsilon_{Au}^{Ar+} C_{Au} P \tag{5}$$

where P is the probability that a gold (B) atom will be sputtered (from material AB) as a negative ion. In our model, the probability factor is closely related to the factor $(I_A-EA_B)$ and to $\Delta X$. We are assuming that the sputtering yield of gold is the same for neutral and ionized species. The resputtered flux is given by:

$$R_{Sm}^{Au-} = (J_{Ar+})(\epsilon_{Au}^{Ar+}) C_{Au} P (\epsilon_{Sm}^{Au-} C_{Sm}') \tag{7}$$

Similarly for gold we obtain:

$$R_{Au}^{Au-} = (J_{Ar+})(\epsilon_{Au-}^{Ar+}) C_{Au} P (\epsilon_{Au}^{Au-} C_{Au}') \tag{8}$$

Substituting equations 3, 4, 5, 7 and 8 into equation 2 gives:

$$A = J_{Ar+}[\epsilon_{Sm}^{Ar+} C_{Sm} + \epsilon_{Au}^{Ar+} C_{Au}(1-P) - \epsilon_{Au}^{Ar+} C_{Au} P(\epsilon_{Sm}^{Au-} C_{Sm}') - (\epsilon_{Au}^{Ar+} - C_{Au} P)(\epsilon_{Au}^{Au-} C_{Au}')] \tag{9}$$

which reduces to:

$$A = J_{Ar+}[(\epsilon_{Sm}^{Ar+} C_{Sm} + \epsilon_{Au}^{Ar+} C_{Au}) - \epsilon_{Au}^{Ar+} C_{Au} P(\epsilon_{Au}^{Au+} C_{Au}' + \epsilon_{Sm}^{Au-} C_{Sm}')] \tag{10}$$

It has been shown that the sputtering yield can be expressed by:

$$\epsilon_b^a = K(E/\lambda)[m_a m_b/(m_a+m_b)^2] \tag{11}$$

where $\epsilon_b^a$ is the yield of "b" atoms under "a" atom bombardment, K is a constant which depends only on the target material, E is the kinetic energy of the incident "a" ions, $\lambda$ is the penetration depth of "a" ions into target "b" and $m_a$ and $m_b$ are the masses of "a" and "b" respectively. Equation (11) is used to get the relative magnitudes of the sputtering yields, for example:

$$\epsilon_{Au}^{Au-}/\epsilon_{Au}^{Ar+} = \lambda^{Ar+}/\lambda_{Au-} \cdot (m_{Au} m_{Au}/m_{Ar} m_{Au}) (m_{Ar}+m_{Au}/m_{Au}+m_{Au})^2 \tag{12}$$

Neglecting the difference in penetration depth we obtain:

$$\epsilon_{Au}^{Au-}/\epsilon_{Au}^{Ar+} = 3.0 \tag{13}$$

Expressing all the other yields relative to $\epsilon_{Au}^{Ar+}$ (hereafter referred to as $\epsilon$) we find:

$$\begin{aligned}\epsilon_{Au}^{Ar+} &= \epsilon \\ \epsilon_{Sm}^{Ar+} &= 1.2\epsilon \\ \epsilon_{Au}^{Au-} &= 3\epsilon \\ \epsilon_{Sm}^{Au-} &= 1.4\epsilon\end{aligned} \tag{14}$$

for the SmAu case.

More generally, we assume that the sputtering yields can be related to each other by a constant so that:

$$\begin{aligned}\epsilon_{Au}^{Ar+} &= \epsilon \\ \epsilon_{Sm}^{Ar+} &= K_1\epsilon \\ \epsilon_{Au}^{Au-} &= K_2\epsilon \\ \epsilon_{Sm}^{Au-} &= K_3\epsilon\end{aligned} \tag{15}$$

Substituting 15 into 10 and replacing $C_{Sm}$ by $1-C_{Au}$ ($C_{Au} = C$ hereafter) gives:

$$A = J_{Ar} + \{[K_1\epsilon(1-C) + \epsilon C] - \epsilon CP[K_2\epsilon C' + K_2\epsilon(1-C')]\}$$
$$A = J_{Ar} + \epsilon\{[K_1(1-C)+C] - CP[K_2\epsilon C' + K_3\epsilon(1-C')]\}$$
$$A = J\epsilon\{[K_1-K_1C+C] - \epsilon CP[K_2C' + K_3(1-C')]\} \quad (16)$$

As shown previously in J. J. Cuomo and R. J. Gambino, *J. Vac. Sci. Tech* 12, 79 (1975), the dependence of J and $\epsilon$ as a function of voltage can be approximated by:

$$J = \alpha V^{1/2} \quad (17)$$

where V is the accelerating potential experienced by a positive ion at an electrode with a negative bias of $-V_t$, and $$\epsilon = \beta V^{1/2} \text{ neglecting threshold,} \quad (18)$$

so that equation 16 can be written:

$$A = \alpha\beta V\{[K_1-K_1C+C] - \beta V^{1/2}CP[K_2C' + K_3(1-C')]\}, \quad (19)$$

which is in the form:

$$A/V = a - bV^{1/2}, \quad (20)$$

where $a = \alpha\beta[K_1-K_1C+C]$
$b = \beta CP[K_2C' + K_3(1-C')]$.

When an accelerating potential $V_O$ is reached such that the accumulation goes to zero, etching will be observed. $V_O$ is a potential experienced by a positive ion at an electrode with a negative bias of $V_t$, which provides zero accumulation of sputtered material on the substrate. This accelerating potential, $V_O$, is given by:

$$A/V_O = 0/V_O = a - bV_O^{1/2}$$
$$V_O^{1/2} = a/b \quad (21)$$

If the substrate material (e.g., Si) is not the same as the target, at voltages greater than $V_O$ the substrate material is being excited so there is an additional resputtering term in equation (19) which becomes:

$$A = \alpha\beta V\{[K_1-K_1C+C] - \beta V^{1/2}CP[K_2C_{Au}' + K_3C_{Sm}' + K_4C_{Si}']\}$$
where $\epsilon_{Si}^{Au} = k_4\epsilon \quad (22)$ and $C_{Si}'$ is the surface concentration of Si on the substrate. Equation 22 is of the same form as 20:

$$A/V = a - b'V^{1/2}. \quad (23)$$

Figure 7:
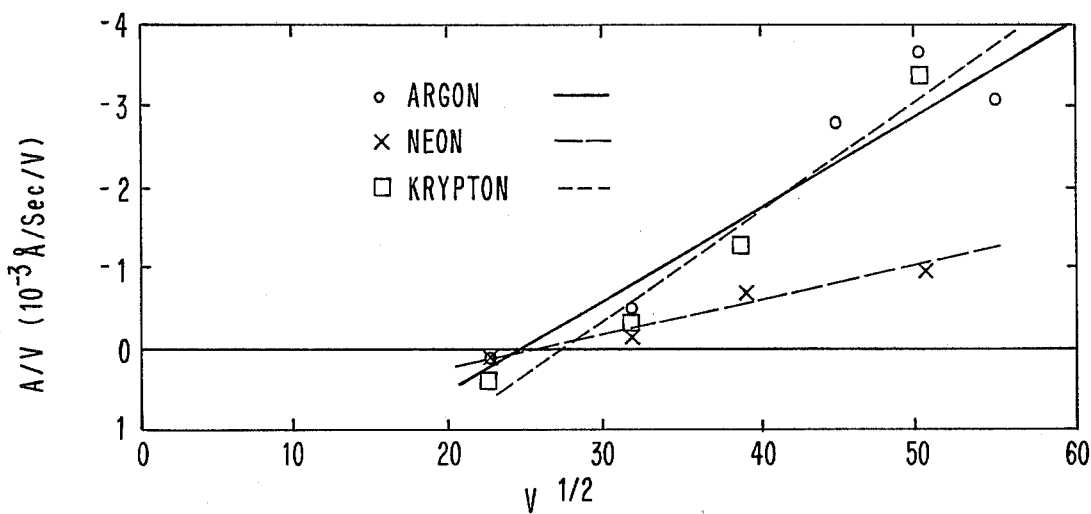
FIG. 7 is a plot of the ratio (accumulation rate)/(target voltage) vs. (target voltage) to the ½ power for various sputtering gases. The target was composed of SmAu. Parameters were the same as in FIG. 3.
Figure 8:
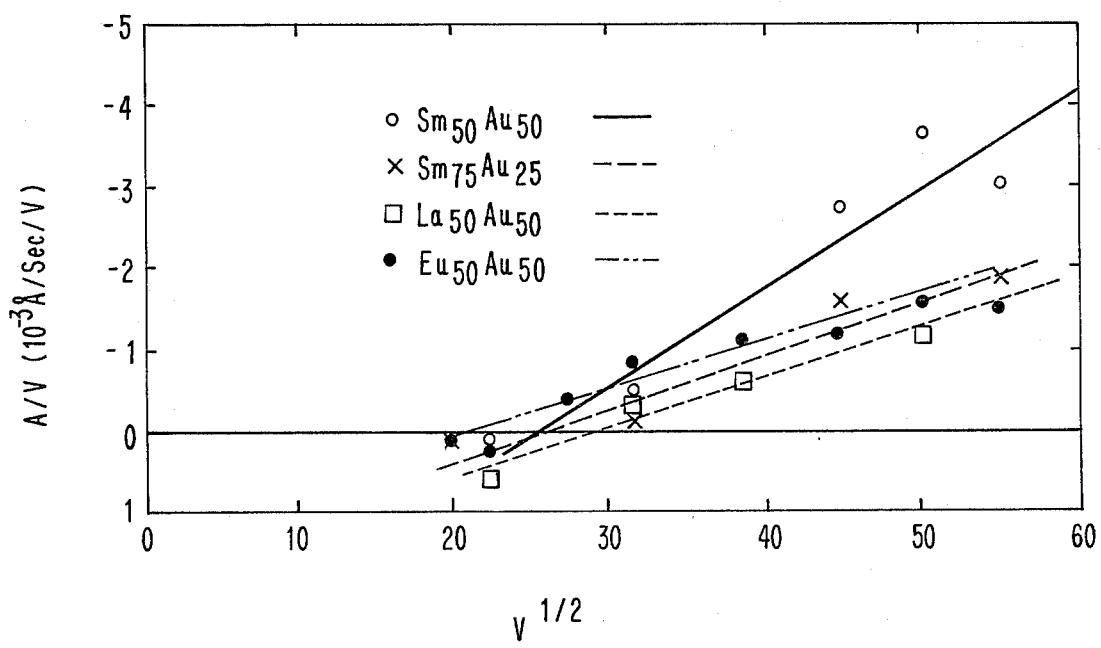
FIG. 8 is a plot of the ratio (accumulation rate)/(target voltage) vs. (target voltage) to the ½ power for various targets. Parameters were the same as in FIG. 3.

It should be noted that the surface concentrations on the substrate are functions of V so that treating a, b and b' in equations 20 and 23 as constants is only an approximation. Within this approximation, we expect A/V to be a linear function of $V^{1/2}$. The data for SmAu sputtered in Ne, Ar and Kr are shown in FIG. 7 plotted in this manner. Similar data for various targets sputtered in argon are shown in FIG. 8.

This functional dependence of A on V appears to be roughly confirmed. This may be understood as the difference between two rates. The positive accumulation rate proportional to V is the material sputtered from the target. (The product of the sputter yield dependence of V and ion current dependence of $V^{1/2}$.) The negative accumulation rate proportional to V is the resputtering rate from the substrate (which has an additional $V^{1/2}$ factor due to the yield dependence of $V^{1/2}$).

We have attempted to demonstrate the same functional dependence of etch rate during DC sputtering in which the target current may be directly measured. Preliminary results show that etching also occurs in DC sputtering, but the voltage dependence is not consistent with the RF measurements. A more detailed understanding of the negative ion generation process is clearly needed.

CONCLUSIONS

The sputtering of certain compounds has been found to generate large quantities of negative ions, which are capable of suppressing deposition rates to the point of substrate etching. SIMS analysis confirms large yields of negative ions from these compounds. A model based on ionization potential and electron affinity predicts the occurrence of negative ions and correlates with the observed etching phenomenon. The model predicts that negative ion phenomena will occur in a wide range of materials. Quantitative SIMS analysis must also take account of negative ion yields.

The major dependence of substrate etch rate on sputtering parameters is on target voltage. The functional dependence is consistent with a simple model which considers only the sputtered flux from the target and resputtered flux from the substrate due to negative ion bombardment.

Negative ions originating at the target may have effects on the properties of sputtered films other than simple etching. For example, low mass negative ions may be implanted in the film causing implantation damage and composition changes. Some of the effects previously attributed to energetic neutrals originating at the target may in fact be negative ion effects. Since the flux of negative ions and energetic neutrals should both show a pronounced target voltage dependence further SIMS studies will be required to discriminate between these two phenomena.

Targets which yield a high flux of negative ions may be useful for some unique methods of thin film processing. For example, simply by changing the target voltage from a high value to a low value it is possible to go from an etching condition to a deposition condition without interruption. Major improvements in adhesion and unusual metal-semiconductor interface properties may be achievable by this process.

EXAMPLES I - IX

See Table VI below for Variables A' to H

A target 10 with the composition A' was prepared by arc melting the constituent elements into a molybdenum dish. The target was subjected to A ion bombardment by applying B volts (D.C. level with respect to ground) by means 13.54 mHz radio frequency generator. The inert gas pressure during the experiment was maintained at 30 (C) mTorr. The Si (D) substrates 12 supported on water cooled anode 16 were biased to E volts. The substrates were exposed to the negative ion flux from the target for 60 (F) minutes. In this period of time the substrates were etched to a depth of G μm corresponding to an etch rate of H Å/sec.

TABLE VI

| Example | Composition A' | Gas Species A | $V_t$ B | Pressure C | Substrate D | $V_S$ E | Time F | Etch Depth G | Etch Rate H |
|---|---|---|---|---|---|---|---|---|---|
| | | | V | mTorr | | V | Min. | μm | A/sec. |
| | | | RF Sputtering | | | | | | |
| I | LaF$_3$ | Ar | −1000 | 30 | Si | −50 | 60 | −0.2 | .55 |
| II | LaAu | Ar | −1000 | 30 | Si | −50 | 60 | −0.1 | .28 |
| III | LaAu | Ar | −1500 | 30 | Si | −50 | 60 | −0.3 | .83 |
| IV | SmAu | Ar | −1000 | 30 | Si | −50 | 60 | −0.18 | .50 |
| V | SmAu | Ar | −2000 | 30 | Si | −50 | 60 | −2.0 | 5.50 |
| VI | SmAu | Kr | −2500 | 30 | Si | −50 | 60 | −3.1 | 8.60 |
| VII | EuAu | Ar | −1000 | 30 | Si | −50 | 60 | −0.3 | .83 |
| IX | EuAu | Ar | −3000 | 30 | Si | −50 | 60 | −1.5 | 4.20 |
| | | | DC Sputtering | | | | | | |
| IX (Target Current 12 ma) | SmAu | Ar | −3000 | 30 | Si | −100 | 60 | −1.4 | 3.89 |

Determination of whether a material is suitable for etching when used as a negative ion source can be made by calculation of the Etching Threshold Voltage ($V_o$) with the equation derived from equation 21 above:

$$V_o^{1/2} = \frac{a}{b} = \frac{a[K_1 - K_1 C + C]}{CP[K_2 C + K_3(1-C)]} \quad (24)$$

To emphasize the dominant dependence of $V_o^{1/2}$ on P we rewrite this equation:

$$V_o^{1/2} = \frac{a^*}{P} \text{ where } a^* = \frac{a[K_1 - K_1 C + C]}{C[K_2 C + K_3(1-C)]} \quad (25)$$

For a given sputtering gas, gas pressure and system geometry, $a^*$ will be approximately constant for all target materials. P is the probability of a B atom sputtering from the material AB leaving as a negative ion and it is approximately equal to the fractional ionicity Q which is the fraction of an electron transferred from atom A to atom B in the composition (solid or liquid) AB.

The fractional ionicity, Q can be calculated from electronegativity data.

The value of $a^*$ can be determined experimentally for a given sputtering apparatus and gas by determining the accumulation rate $A/V_t$ at three values of target voltage for one target material known to yield a large flux of negative ions e.g. SmAu. The target voltages $V_t$ used in this test should span the range 0.5 to 3 K.V. The observed accumulation rates are then plotted in the manner shown in FIG. 7, i.e., A/V vs. $V^{1/2}$. The best straight line drawn through the data points will pass through $A/V = 0$ at $V^{1/2} = V_o^{1/2}$. Alternatively, the equations;

$$\frac{A_1}{V_1} = a - b V_1^{1/2} \quad (25a)$$

$$\frac{A_2}{V_2} = a - b V_2^{1/2} \quad (25b)$$

can be solved simultaneously for a and b and $V_o^{1/2}$ calculated using equation 24. Having found the value of $V_o^{1/2}$ for one target, $a^*$ for the apparatus used can be determined using:

$$a^* = V_o^{1/2} P \quad (25c)$$

The Etching Threshold Voltage $V_o$ for all target materials can be determined using equation 25.

We find a value of 6.6 for $a^*$ from our data on REAu compositions sputtered in argon.

The fractional ionicity, Q, is determined as follows. The electronegativity difference, ΔX, is obtained by taking the difference in the Mulliken scale of electronegativity (see H. B. Michaelson, above) of the two elements in the alloy or compound; AB:

$$\Delta X_M = X_A - X_B \quad (26)$$

The equation relating P to ΔX (N. B. Hannay and C. P. Smyth, JACS, Vol. 68, p. 171 (1946) is based on the Pauling scale of electronegativity so the Mulliken scale values must be converted to Pauling scale values by dividing by 2.4:

$$\Delta X_p = \frac{\Delta X_M}{2.4} \quad (27)$$

The Q can be calculated from:

$$Q = \frac{16(\Delta X_P) + 3.5(\Delta X_P)^2}{100} \quad (28)$$

(See Hannay and Smyth above.)

The relation in equation 25 shows that a negative ion source material sputtered in argon in a system having $a^* = 6.6$ will have an Etching Threshold Voltage, $V_o$, in excess of 1000 volts if P is less than about 0.2, i.e., if it has less than 20% ionic character. Since $V_o$ is that voltage which must be exceeded for an infinitesimal etch rate, practical etch rates wil not be achieved until the target voltage, $V_t$, exceeds threshold $V_o$ by a factor of 2 or 3.

From equation 25 we see that $V_o$ depends on $1/P^2$, i.e.:

$$V_o = \frac{(a^*)^2}{P^2} \quad (29)$$

so that $V_o$ increases rapidly with decreasing P below P=0.2 as shown in FIG. 9. While it is possible to use a material with a low P value for negative ion etching by operating the negative ion source at tens of kilovolts, it would not be practical for etching microelectronic circuits because excessive heating and high energy electron and ion bombardment would damage the device. The same etch rate could be achieved using a material with a higher P value with a lower power consumption and with much less damage to the device.

While the electronegativity difference gives a very good approximation of the fractional ionicity or charge transfer, Q, there is a small correction which depends on interatomic distance, as pointed out by C. H. Hodges and M. J. Stott (*Phil. Mag.* 26, 375 (1975)). The charge transfer is proportional to the square of the A-B interatomic distance so that for small rare earth atoms such as Lu the distance from gold is greatly reduced as compared with europium. Accordingly, LuAu does not etch below 3000 volts target potential.

Target voltages above 3000 V are so high as to be unacceptable because of the destructive effect caused by the high particle velocities and heat.

Compositions including mixtures, compounds, alloys, etc. which will produce the desired level of negative metal ion etching for target voltages in the satisfactory range below 3000 volts based upon electronegativity difference such that $X_B - X_A$ is greater than about 2.75 electron volts are as follows:

B metal is Au and the A metal is selected from the group including Li, Na, K, Rb, Sr, In, Cs, Ba, La, Ce, Pr, Nd, Pm, Sm, Eu, Tb, and Dy.

B metal is Pt and the A metal is selected from the group including: Li, K, Rb, Cs, Ba, La, Ce, Pr, and Nd.

B metal is Ir and the A metal is selected from the group including: K, Rb, Cs, and Ba.

B metal is Hg and the A metal is selected from the group including K, Rb, Cs, and Ba.

B metal is Po and the A metal is selected from the group including: K, Rb, Cs, and Ba.

B metal is Os and the A metal is selected from Rb and Cs.

B metal is Sb and the A metal is Cs.

B metal is Zn and the A metal is Cs.

According to Hodges et al above, Q is equal to the differences in Fermi energies times the square of ½ the interatomic distances between elements of a compound. This should apply to alloys as well. Michaelson (above) has shown that $\Delta X = X_B - X_A$ is equal to the difference in Fermi energies. Thus $$Q = K(X_B - X_A)(\frac{r_A + R_B}{2})^2$$

where $K = 4.376 \times 10^{-2}$, $r_A$ and $r_B$ are atomic radii in Angstroms of metals A and B, and $(r_A + r_B)$ is an approximation to the interatomic distance of a compound. $X_B$ and $X_A$ are measured in electron volts. We have calculated Q for the RE series in Table VII where $r_{Au} = 1.46$ Å and for other compounds and alloys having the proper value of $\Delta X$ above 2.55 in Table VIII and have determined that the critical minimum value of Q is about 0.314, between Sm (0.316) and Lu (0.312) since Sm etches at a target potential of about 3000 volts and Lu does not. It is assumed that other compositions such as ground powders of metals which have been treated in such a way that they are dispersed by heating, or possibly by sputtering if ground finely enough will approach appropriate interatomic distances, but here the parameters of invention are less clearly predictable because the embodiments are more variable in a macroscopic scale.

Applicants submit that it is possible to etch by sputtering other metals at target voltages above 3000 volts to the degree that they also will etch, but the disadvantage is that the substrate will be exposed to damage from the high ion energies.

Table VII

Q for Re Au Combinations

| | $\Delta X$ | $r_A$ metallic | $r_A + r_{B/2}$ | $(r_A + r_{B/2})^2$ | Q |
|---|---|---|---|---|---|
| LaAu | 2.73 | 1.875 | 1.67 | 2.78 | 0.332 |
| CeAu | 2.78 | 1.825 | 1.64 | 2.70 | 0.328 |
| PrAu | 2.81 | 1.828 | 1.64 | 2.70 | 0.332 |
| NdAu | 2.77 | 1.821 | 1.64 | 2.69 | 0.326 |
| PmAu | 2.74 | 1.810 | 1.635 | 2.57 | 0.320 |
| SmAu | 2.70 | 1.81 | 1.64 | 2.67 | 0.316 |
| EuAU | 2.68 | 2.042 | 1.75 | 3.07 | 0.360 |
| GdAu | 2.45 | 1.802 | 1.631 | 2.66 | 0.285 |
| TbAu | 2.59 | 1.782 | 1.621 | 2.63 | 0.298 |
| DyAu | 2.55 | 1.773 | 1.617 | 2.61 | 0.291 |
| HoAu | 2.51 | 1.766 | 1.613 | 2.60 | 0.286 |
| ErAu | 2.47 | 1.757 | 1.609 | 2.59 | 0.280 |
| TmAu | 2.43 | 1.746 | 1.603 | 2.57 | 0.273 |
| YbAu | 2.39 | 1.94 | 1.700 | 2.89 | 0.302 |
| LuAu | 2.80 | 1.734 | 1.60 | 2.55 | 0.312 |
| YAu | 2.58 | 1.801 | 1.631 | 2.66 | 0.300 |

Table VIII

| Metal A | $X_A$ | $r_A$ | Metal B | $X_B$ | $r_B$ | $\Delta X$ | Q |
|---|---|---|---|---|---|---|---|
| Li | 3.0 | 1.55 | Au | 5.77 | 1.46 | 2.77 | .274 |
| " | " | " | Pt | 5.57 | 1.39 | 2.57 | .24 |
| Na | 2.85 | 1.90 | Au | 5.77 | 1.46 | 2.92 | .36 |
| " | " | " | Pt | 5.57 | 1.39 | 2.72 | .36 |
| K | 2.42 | 2.35 | Ir | 5.35 | 1.36 | 2.93 | .441 |
| " | " | " | Pt | 5.57 | 1.39 | 3.15 | .482 |
| " | " | " | Au | 5.77 | 1.46 | 3.35 | .532 |
| " | " | " | Hg | 5.22 | 1.57 | 2.80 | .471 |
| " | " | " | Po | 5.16 | 1.76 | 2.74 | .506 |
| Ca | 3.06 | 1.97 | Au | 5.77 | 1.46 | 2.71 | .349 |
| " | " | " | Os | 4.90 | 1.35 | 2.56 | .411 |
| Rb | 2.34 | 2.48 | Ir | 5.35 | 1.36 | 3.01 | .486 |
| " | " | " | Pt | 5.57 | 1.39 | 3.23 | .529 |
| " | " | " | Au | 5.77 | 1.46 | 3.43 | .583 |
| " | " | " | Hg | 5.22 | 1.57 | 2.88 | .517 |
| " | " | " | Po | 5.16 | 1.76 | 2.82 | .555 |
| Sr | 2.85 | 2.15 | Pt | 5.57 | 1.39 | 2.72 | .373 |
| " | " | " | Au | 5.77 | 1.46 | 2.92 | .416 |
| In | 3.05 | 1.66 | Au | 5.77 | 1.46 | 2.72 | .290 |
| Cs | 2.18 | 2.67 | Zn | 4.70 | 1.38 | 2.52 | .452 |
| " | " | " | Os | 4.90 | 1.35 | 2.72 | .481 |
| " | " | " | Ir | 5.35 | 1.36 | 3.17 | .563 |
| " | " | " | Pt | 5.57 | 1.39 | 3.39 | .610 |
| " | " | " | Au | 5.77 | 1.46 | 3.59 | .670 |
| " | " | " | Hg | 5.22 | 1.57 | 3.04 | .598 |
| " | " | " | Po | 5.16 | 1.76 | 2.98 | .640 |
| " | " | " | Sb | 4.85 | 1.59 | 2.67 | .530 |
| Ba | 2.61 | 2.22 | Ir | 5.35 | 1.36 | 2.74 | .384 |
| " | " | " | Pt | 5.57 | 1.39 | 2.96 | .422 |
| " | " | " | Au | 5.77 | 1.46 | 3.16 | .468 |
| " | " | " | Hg | 5.22 | 1.57 | 2.61 | .410 |
| " | " | " | Po | 5.16 | 1.71 | 2.55 | .442 |

A method of thin film processing includes the steps of negative ion etching a substrate from an electrode followed by sputtering and depositing of material from the same electrode onto said substrate. For example an SmAu target can etch at a higher target voltage and then deposit at a lower target voltage. The reverse sequence can be used as well. Changing from etching to depositing or the reverse can be accomplished by changing the voltage without opening the vaccuum system.

We claim:

1. Apparatus comprising an evacuable vacuum chamber including a target and a source of energetic particles for bombarding said target,
   wherein said target constitutes a negative-metallic-ion-source material which comprises a source of negative ions of a metal B included in an intermetallic composition including at least two metals A and B, metal B being adapted when in combination with metal A to be ionized to a substantial degree to form quantities of negative ions of metal B upon bombardment by energetic particles of atomic dimensions wherein metal A has an electronegativity $X_A$ and metal B has an electronegativity $X_B$ such that $X_B - X_A$ is greater than about 2.55 electron Volts, with the exception of combinations of metals having a values of Q less than about 0.314, where Q is the fractional ionicity of said intermetallic composition.

2. Apparatus in accordance with claim 1 wherein said metal B is Au and said metal A has an electronegativity less than about 3.09 with the exception of combinations of said metals having a value of Q less than about 0.314.

3. Apparatus in accordance with claim 2 wherein said metal A is selected from the group including: Ce, Pm, Sm, La, Eu, Pr, Nd and Cs.

4. Apparatus in accordance with claim 1 wherein said metal B is Au and said metal A is selected from the group including: Ce, Pm, Sm, La, Eu, Pr, Nd, and Cs.

5. Apparatus in accordance with claim 1 wherein said metal B is Au.

6. Apparatus in accordance with claim 5 wherein said metal A is Ce.

7. Apparatus in accordance with claim 5 wherein said metal A is Pm.

8. Apparatus in accordance with claim 5 wherein said metal A is Sm.

9. Apparatus in accordance with claim 5 wherein said metal A is La.

10. Apparatus in accordance with claim 5 wherein said metal A is Eu.

11. Apparatus in accordance with claim 5 wherein said metal A is Pr.

12. Apparatus in accordance with claim 5 wherein said metal A is Nd.

13. Apparatus in accordance with claim 5 wherein said metal A is Cs.

14. Apparatus comprising an evacuable vacuum chamber including a target and a source of energetic particles for bombarding said target,
wherein said targets constitutes a negative-metallic-ion-source material which comprises a source of negative ions of a metal B included in an intermetallic composition including at least two metals A and B, wherein metal B is adapted when in combination with metal A to be ionized in effective amounts to form quantities of negative ions of metal B upon bombardment by energetic particles of atomic dimensions, said material comprising a composition selected from one of the following groups of A and B metals including
a group in which the B metal is Au and the A metal is selected from the group including: Li, Na, K, Rb, Sr, In, Cs, Ba, La, Ce, Pr, Nd, Pm, Sm, Eu, Tb, and Dy;
a group in which the B metal is Pt and the A metal is selected from the group including: Li, Na, K, Rb, Cs, Ba, La, Ce, Pr, and Nd;
a group in which the B metal is selected from the group including: Ir, Hg, Po, and Os and the A metal is selected from the group including: K, Rb, Cs, and Ba;
a group in which the B metal is Os and the A metal is selected from the group including: Rb and Cs; and
a group in which the B metal is selected from the group including: Sb and Zn and the A metal is Cs.

15. A method of etching a substrate located across from a target electrode in a partially evacuated sputtering chamber wherein a sputtering gas is employed to bombard said target electrode characterized in that said electrode composed of an intermetallic composition of an A metal and a B metal is being bombarded with energetic particles of atomic dimensions and the target voltage $V_t$ exceeds the etching threshold voltage $V_o$,
metal A has an electronegativity $X_A$ and metal B has an electronegativity $X_B$ such that $X_B - X_A$ is greater than about 2.55 electron Volts, with the exception of combinations of metals having a value of Q of less than about 0.314, and a quantity of the B atoms leaving said target electrode and negative ions and said ions possess sufficient energy to produce an effective amount of etching, where Q is the fractional ionicity of said intermetallic composition.

16. A method in accordance with claim 15 wherein said metal B is Au and said metal A has an electronegativity less than about 3.09 with the exception of combinations of said metals having a value of Q less than about 0.314.

17. A method in accordance with claim 16 wherein said metal A is selected from the group including: Ce, Pm, Sm, La, Eu, Pr, Nd and Cs.

18. A method in accordance with claim 15 wherein said metal B is Au and said metal A is selected from the group including: Ce, Pm, Sm, La, Eu, Pr, Nd, and Cs.

19. A method in accordance with claim 15 wherein said metal B is Au.

20. A method in accordance with claim 19 wherein said metal A is Ce.

21. A method in accordance with claim 19 wherein said metal A is Pm.

22. A method in accordance with claim 19 wherein said metal A is Sm.

23. A method in accordance with claim 19 wherein said metal A is La.

24. A method in accordance with claim 19 wherein said metal A is Eu.

25. A method in accordance with claim 19 wherein said metal a is Pr.

26. A method in accordance with claim 19 wherein said metal A is Nd.

27. A method in accordance with claim 19 wherein said metal A is Cs.

28. A method of etching a substrate located across from a target in a sputtering chamber characterized in that a negative-metallic-ion-source material target of a metal B included in an imtermetallic composition including at least two metals A and B, wherein metal B is in combination with metal A and metal B is ionized in effective amounts by maintaining the target potential $V_t$ above the etching threshold voltage $V_o$ to form quantities of negative ions of metal B upon bombardment by energetic particles of atomic dimensions, said material comprising a composition selected from one of the following groups of A and B metals including
a group in which the B metal is Au and the A metal is selected from the group including: Li, Na, K, Rb, Sr, In, Cs, Ba, La, Ce, Pr, Nd, Pm, Sm, Eu, Tb, and Dy;
a group in which the B metal is Pt and the A metal is selected from the group including: Li, Na, K, Rb, Cs, Ba, La, Ce, Pr, and Nd;
a group in which the B metal is selected from the group including Ir, Hg, Po, and Os and the A metal is selected from the group including: K, Rb, Cs, and Ba;
a group in which the B metal is Os and the A metal is selected from the group including Rb and Cs;

a group in which the B metal is selected from the group including: Sb and Zn and the A metal is Cs; and a source of energetic atomic particles is directed to bombard said source material to produce etching of said substrate by negative B ions, with etching of the surface of said substrate opposite from said material.

29. A method of thin film procesing including the steps of negative ion etching a substrate housed in an evacuated vacuum chamber containing a sputtering gas by means of negative metallic ions generated from a target electrode of intermetallic composition at a voltage $V_t$ greater than the etching threshold voltage $V_o$ of said target electrode followed by lowering said voltage $V_t$ below voltage $V_o$ for sputtering and depositing of material from said target electrode onto said substrate.

* * * * *